(12) United States Patent
Lee et al.

(10) Patent No.: US 11,990,439 B2
(45) Date of Patent: May 21, 2024

(54) SEMICONDUCTOR PACKAGE INCLUDING UNDER BUMP METALLIZATION PAD

(71) Applicant: SAMSUNG ELECTRONICS CO., LTD., Suwon-si (KR)

(72) Inventors: Jaeean Lee, Suwon-si (KR); Changeun Joo, Suwon-si (KR); Gyujin Choi, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 14 days.

(21) Appl. No.: 17/343,992

(22) Filed: Jun. 10, 2021

(65) Prior Publication Data

US 2022/0165693 A1 May 26, 2022

(30) Foreign Application Priority Data

Nov. 25, 2020 (KR) .................. 10-2020-0159622

(51) Int. Cl.
| | | |
|---|---|---|
| *H01L 21/768* | (2006.01) | |
| *H01L 23/00* | (2006.01) | |
| *H01L 23/31* | (2006.01) | |
| *H01L 23/367* | (2006.01) | |
| *H01L 23/495* | (2006.01) | |
| *H01L 23/522* | (2006.01) | |
| *H01L 23/528* | (2006.01) | |

(Continued)

(52) U.S. Cl.
CPC .......... *H01L 24/14* (2013.01); *H01L 23/5226* (2013.01); *H01L 23/528* (2013.01); *H01L 23/53204* (2013.01); *H01L 2224/0401* (2013.01)

(58) Field of Classification Search
CPC ... H01L 24/14; H01L 23/5226; H01L 23/528; H01L 23/53204; H01L 2224/0401; H01L 2924/01047; H01L 2924/013; H01L 2924/00014; H01L 2224/13111; H01L 2924/01029; H01L 2224/05599; H01L 2224/05147
See application file for complete search history.

(56) References Cited

U.S. PATENT DOCUMENTS

| | | |
|---|---|---|
| 7,348,669 B2 | 3/2008 | Ko |
| 7,589,422 B2 | 9/2009 | Lee et al. |

(Continued)

FOREIGN PATENT DOCUMENTS

| | | |
|---|---|---|
| KR | 10-2019-0004597 A | 1/2019 |
| KR | 10-2019-0004598 A | 1/2019 |

*Primary Examiner* — Marcos D. Pizarro
*Assistant Examiner* — Tenley H Schofield
(74) *Attorney, Agent, or Firm* — Fish & Richardson P.C.

(57) ABSTRACT

A semiconductor package including a semiconductor chip; a lower redistribution layer on a lower surface of the semiconductor chip; a lower passivation layer on a lower surface of the lower redistribution layer; a UBM pad on the lower passivation layer and including an upper pad and a lower pad connected to the upper pad, the upper pad having a greater horizontal length at an upper surface thereof than a horizontal length at a lower surface thereof; a seed layer between the lower passivation layer and the UBM pad; and an external connecting terminal on a lower surface of the UBM pad, wherein the seed layer includes a first seed part covering a side surface of the upper pad, a second seed part covering a portion of the lower surface of the upper pad, and a third seed part covering a portion of a side surface of the lower pad.

15 Claims, 17 Drawing Sheets

(51) Int. Cl.
  *H01L 23/532* (2006.01)
  *H01L 25/065* (2023.01)

(56) References Cited

U.S. PATENT DOCUMENTS

| | | | |
|---|---|---|---|
| 7,659,632 | B2 | 2/2010 | Tsao et al. |
| 8,354,750 | B2 | 1/2013 | Wang et al. |
| 8,569,897 | B2 | 10/2013 | Liu et al. |
| 10,026,668 | B1 | 7/2018 | Lee et al. |
| 10,347,556 | B2 | 7/2019 | Lee et al. |
| 10,403,579 | B2 * | 9/2019 | Lee .................. H01L 23/5383 |
| 10,700,026 | B2 | 6/2020 | Chen et al. |
| 10,879,189 | B2 | 12/2020 | Lee et al. |
| 2007/0290343 | A1 * | 12/2007 | Harada ................ H01L 24/11 |
| | | | 257/737 |
| 2011/0074034 | A1 * | 3/2011 | Seddon ................ H01L 23/58 |
| | | | 257/762 |
| 2011/0266670 | A1 * | 11/2011 | England .............. H01L 23/562 |
| | | | 257/773 |
| 2016/0027747 | A1 * | 1/2016 | Ryu .................... H01L 24/05 |
| | | | 257/737 |
| 2017/0365571 | A1 * | 12/2017 | Matsuda ............. H01L 21/486 |
| 2020/0091098 | A1 * | 3/2020 | Matsuda ............. H01L 24/13 |
| 2020/0373219 | A1 * | 11/2020 | Hsu .................... H01L 24/32 |
| 2021/0351144 | A1 * | 11/2021 | Hsu .................... H01L 24/03 |

* cited by examiner

SEMICONDUCTOR PACKAGE INCLUDING UNDER BUMP METALLIZATION PAD

CROSS-REFERENCE TO THE RELATED APPLICATION

Korean Patent Application No. 10-2020-0159622 filed on Nov. 25, 2020 in the Korean Intellectual Property Office, and entitled: "Semiconductor Package Including UBM Pad," is incorporated by reference herein in its entirety.

BACKGROUND

1. Field

Embodiments relate to a semiconductor package including an under bump metallization (UBM) pad.

2. Description of the Related Art

An under bump metallization (UBM) pad may be formed using a semi-additive process (SAP) in which a seed layer made of copper is disposed on an asymmetrical carrier, coating a photoresist, subjecting the photoresist to light exposure and development, performing a plating process, peeling off the photoresist, and etching a seed part.

SUMMARY

The embodiments may be realized by providing a semiconductor package including a semiconductor chip; a lower redistribution layer on a lower surface of the semiconductor chip; a lower passivation layer on a lower surface of the lower redistribution layer; an under bump metallization (UBM) pad on the lower passivation layer, the UBM pad including an upper pad and a lower pad connected to the upper pad, the upper pad having a greater horizontal length at an upper surface thereof than a horizontal length at a lower surface thereof; a seed layer between the lower passivation layer and the UBM pad; and an external connecting terminal on a lower surface of the UBM pad, wherein the seed layer includes a first seed part covering a side surface of the upper pad, a second seed part covering at least a portion of the lower surface of the upper pad, and a third seed part covering at least a portion of a side surface of the lower pad.

The embodiments may be realized by providing a method for manufacturing a semiconductor package, the method including forming a first passivation layer on an asymmetrical carrier; forming a second passivation layer on the first passivation layer; forming a seed layer covering an inner portion of the first passivation layer and an inner portion of the second passivation layer; forming an under bump metallization (UBM) pad covering at least a portion of the seed layer; performing a vertical etching process on the first passivation layer to expose at least another portion of a lower surface of the UBM pad; performing a horizontal etching process on a portion of the seed layer covered by the lower surface of the UBM pad; and forming an external connecting terminal on the exposed lower surface portion of the UBM pad.

The embodiments may be realized by providing a semiconductor package including a semiconductor chip; a lower redistribution layer on a lower surface of the semiconductor chip, the lower redistribution layer including a lower insulating layer and a lower wiring pattern; an encapsulation layer covering the semiconductor chip and the lower redistribution layer; a lower passivation layer on a lower surface of the lower redistribution layer; an under bump metallization (UBM) pad in the lower passivation layer, the UBM pad including an upper pad and a lower pad connected to the upper pad, the upper pad having a greater horizontal length at an upper surface thereof than a horizontal length at a lower surface thereof; a seed layer between the lower passivation layer and the UBM pad; an external connecting terminal on a lower surface of the UBM pad, the external connecting terminal being configured to electrically interconnect the UBM pad to an exterior; a UBM via on the lower passivation layer, the UBM via electrically interconnecting the lower redistribution layer and the UBM pad; an upper redistribution layer on an upper surface of the semiconductor chip, the upper redistribution layer including an upper insulating layer and an upper wiring pattern; a connection layer electrically interconnecting the lower redistribution layer and the upper redistribution layer; and an upper passivation layer on the upper redistribution layer, wherein the seed layer includes a first seed part surrounding a side surface of the upper pad, a second seed part surrounding at least a portion of the lower surface of the upper pad, and a third seed part surrounding at least a portion of a side surface of the lower pad.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
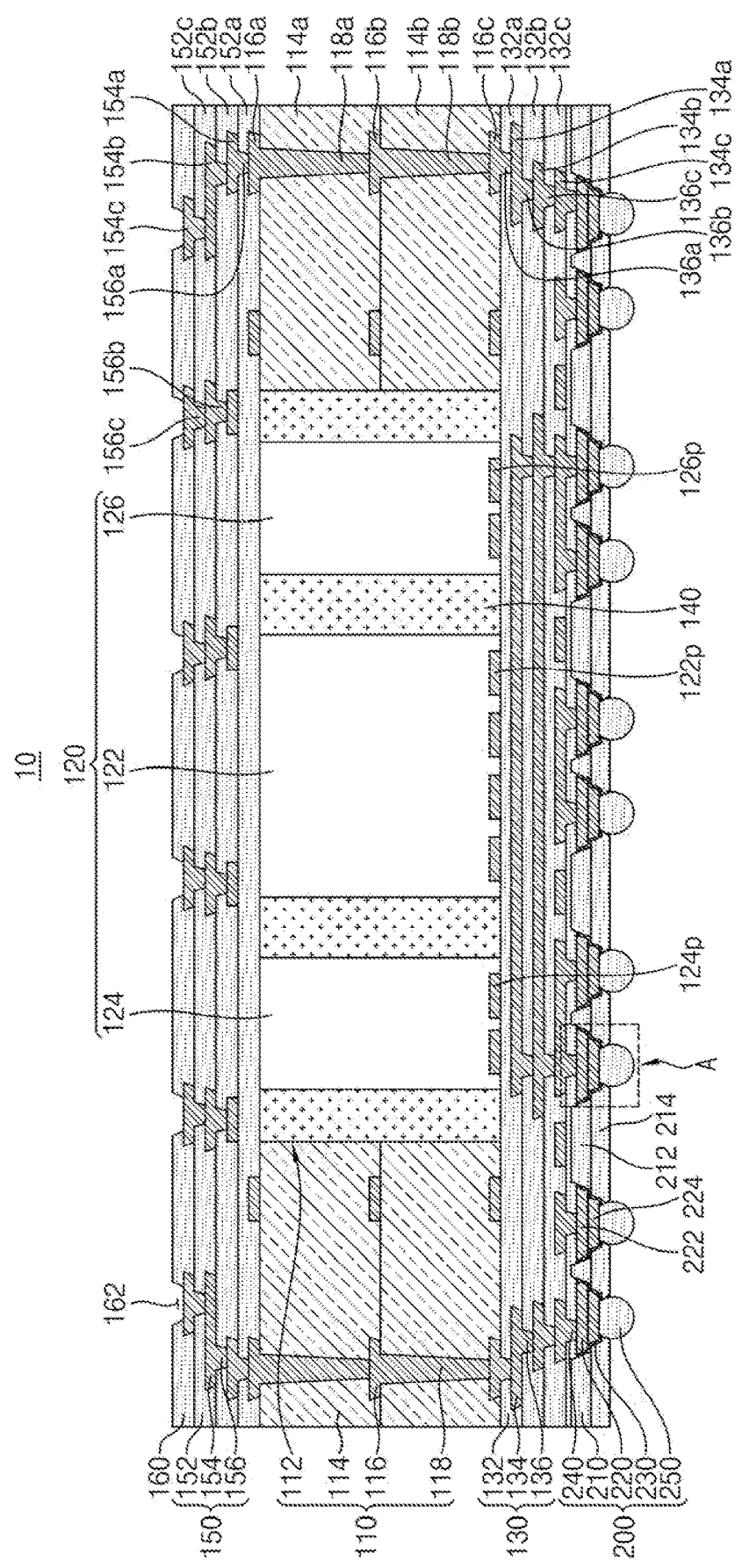
FIG. 1 is a sectional view of a semiconductor package according to an exemplary embodiment of the disclosure.
Figure 2:
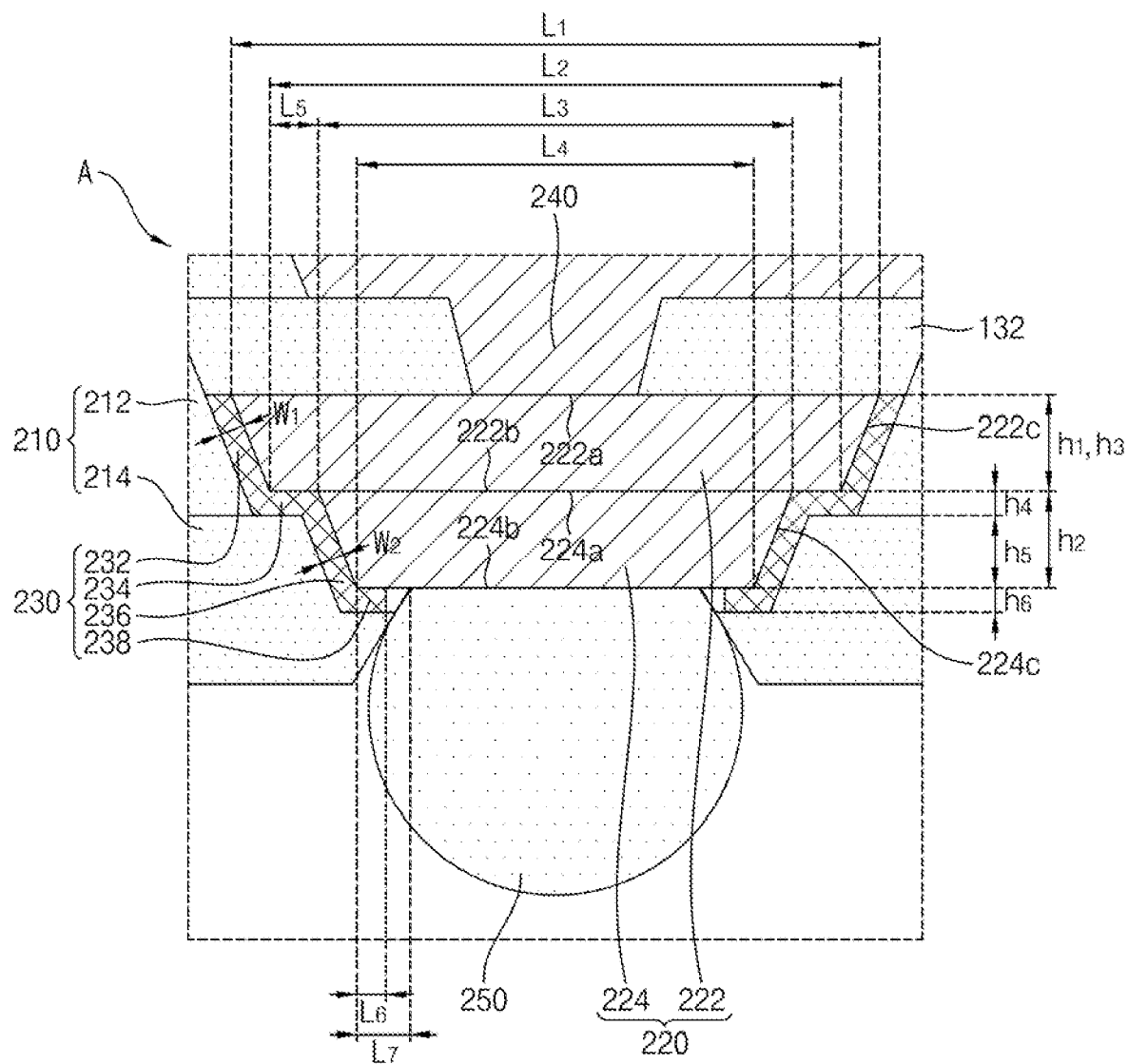
FIG. 2 is an enlarged view of a portion A in FIG. 1.

FIG. 1 is a sectional view of a semiconductor package according to an exemplary embodiment of the disclosure. FIG. 2 is an enlarged view of a portion A in FIG. 1.

Referring to FIGS. 1 and 2, a semiconductor package 10 may include a connection layer 110, a plurality of semiconductor chips 120, a lower redistribution layer 130, an under bump metallization (UBM) layer 200, an encapsulation layer 140, an upper redistribution layer 150, and an upper passivation layer 160.

The connection layer 110 may be a plate having a quadrangular rim shape when viewed in a top or plan view. The connection layer 110 may include a cavity 112, a core 114, a conductive pad 116, and a conductive via 118. The cavity 112 may be at a central portion of the connection layer 110. The core 114 may include a first core 114a at an upper side (e.g., distal to the lower redistribution layer 130), and a second core 114b at a lower surface of the first core 114a and contacting an upper surface of the lower redistribution layer 130 (e.g., at a lower surface of the second core 114b). The conductive pad 116 may include a first conductive pad 116a at an upper surface of the first core 114a, a second conductive pad 116b under or at a bottom end of the first core 114a, and a third conductive pad 116c under or at a bottom end of the second core 114b. The conductive via 118 may include a first conductive via 118a electrically interconnecting the first conductive pad 116a and the second conductive pad 116b and extending through the first core 114a, and a second conductive via 118b electrically interconnecting the second conductive pad 116b and the third conductive pad 116c and extending through the second core 114b.

In an implementation, the core 114 may include an insulating material. The insulating material may include a thermosetting resin, e.g., an epoxy resin, a thermoplastic resin, e.g., polyimide, or a resin formed by impregnating the thermosetting resin or the thermoplastic resin into a core, e.g., an inorganic filler, a glass fiber (glass fiber, glass cloth, or glass fabric), or the like, e.g., a prepreg, an Ajinomoto build-up film (ABF), FR-4, or bismaleimide triazine (BT).

The conductive pad 116 may include an electrolytically deposited (ED) copper foil, a rolled-annealed (RA) copper foil, a stainless steel foil, an aluminum foil, an ultra-thin copper foil, sputtered copper, or copper alloys. In an implementation, the conductive via 118 may include, e.g., copper, nickel, stainless steel, or beryllium copper. As used herein, the term "or" is not an exclusive term, e.g., "A or B" would include A, B, or A and B.

The plurality of semiconductor chips 120 may be in the cavity 112. In an implementation, the plurality of semiconductor chips 120 may include a first semiconductor chip 122, a second semiconductor chip 124, and a third semiconductor chip 126. The first semiconductor chip 122 may be at a central portion of the cavity 112. The first semiconductor chip 122 may include a first chip pad 122p. The first chip pad 122p may be on a bottom surface of the first semiconductor chip 122, and may have a structure protruding from the bottom surface of the first semiconductor chip 122.

The second semiconductor chip 124 may be at one side of the first semiconductor chip 122. The second semiconductor chip 124 may be horizontally spaced apart from the first semiconductor chip 122. The second semiconductor chip 124 may include a second chip pad 124p. The second chip pad 124p may be on a bottom surface of the second semiconductor chip 124, and may have a structure protruding from the bottom surface of the second semiconductor chip 124.

The third semiconductor chip 126 may be at the other side of the first semiconductor chip 122. The third semiconductor chip 126 may be horizontally spaced apart from the first semiconductor chip 122. The third semiconductor chip 126 may include a third chip pad 126p. The third chip pad 126p may be on a bottom surface of the third semiconductor chip 126, and may have a structure protruding from the bottom surface of the third semiconductor chip 126.

Each of the first semiconductor chip 122, the second semiconductor chip 124 and the third semiconductor chip 126 may be an application processor (AP) chip such as a microprocessor, a microcontroller, or the like, a logic chip such as a central processing unit (CPU), a graphics processing unit (GPU), a modem, an application-specific integrated circuit (ASIC), a field programmable gate array (FPGA), or the like, a volatile memory such as dynamic random access memory (DRAM), static random access memory (SRAM), or the like, a non-volatile memory chip such as phase-changeable random access memory (PRAM), magneto-resistive random access memory (MRAM), ferroelectric random access memory (FeRAM), resistive random access memory (RRAM), or the like, flash memory or high-bandwidth memory (HBM), or may be configured by a combination thereof. In an implementation, the first semiconductor chip 122 may be an application processor chip or a logic chip, an each of the second semiconductor chip 124 and the third semiconductor chip 126 may be a volatile memory, a non-volatile memory, flash memory, or HBM.

The lower redistribution layer 130 may be at or on a lower surface of the connection layer 110. The lower redistribution layer 130 may include an insulating layer 132, a redistribution pattern 134, and a conductive via 136. The redistribution pattern 134 and the conductive via 136 may constitute a wiring pattern. The insulating layer 132 may include a first insulating layer 132a contacting the lower surface of the connection layer 110 at an upper surface of the insulating layer 132, a second insulating layer 132b on a lower surface of the first insulating layer 132a, and a third insulating layer 132c on a lower surface of the second insulating layer 132b. In an implementation, the insulating layer 132 may include an Ajinomoto build-up film (ABF), epoxy, polyimide, or a photosensitive polymer. The photosensitive polymer may include a photosensitive polyimide, polybenzeoxazole, a phenol polymer, or a benzocyclobutene polymer.

The redistribution pattern 134 may include a first redistribution pattern 134a buried in the first insulating layer 132a, a second redistribution pattern 134b on a lower surface of the second insulating layer 132b, and a third redistribution pattern 134c on a lower surface of the third insulating layer 132c. In an implementation, the redistribution pattern 134 may include copper, nickel, stainless steel, or a copper alloy such as beryllium copper.

The conductive via 136 may include a first conductive via 136a electrically interconnecting the first conductive pad 116a and the first redistribution pattern 134a, a second conductive via 136b electrically interconnecting the first redistribution pattern 134a and the second redistribution pattern 134b and extending through the second insulating layer 132b, and a third conductive via 136c electrically interconnecting the second redistribution pattern 134b and the third redistribution pattern 134c and extending through the third insulating layer 132c.

The UBM layer 200 may be on a lower surface of the lower redistribution layer 130. The UBM layer 200 may include a lower passivation layer 210, a UBM pad 220, a seed layer 230, a UBM via 240, and an external connecting terminal 250.

The lower passivation layer 210 may be on the lower surface of the lower redistribution layer 130. The lower passivation layer 210 may include a first passivation layer 212 and a second passivation layer 214. The first passivation layer 212 may be on the lower surface of the third insulating layer 132c. The second passivation layer 214 may be on a lower surface of the first passivation layer 212. A plurality of grooves may be at a lower portion of or in the second passivation layer 214. In an implementation, each groove may have a shape opened at a lower portion thereof, and may have a greater width at an upper surface of the second passivation layer 214 than at a lower surface of the second passivation layer 214. In an implementation, the lower passivation layer 210 may include photo-imagable dielectric (PAD).

The UBM pad 220 may be in the lower passivation layer 210. The UBM pad 220 may include an upper pad 222 and a lower pad 224. In an implementation, the upper pad 222 and the lower pad 224 may be integrated with each other. The upper pad 222 may be in the first passivation layer 212. The upper pad 222 may include an upper surface 222a at or aligned with a middle portion of the first passivation layer 212, a lower surface 222b at or adjacent to a lower portion of the first passivation layer 212, and a side surface 222c connecting corresponding ones of opposite ends of the upper surface 222a and opposite ends of the lower surface 222b. A horizontal length L1 of the upper surface 222a of the upper pad 222 may be greater than a horizontal length L2 of the lower surface 222b. The horizontal length L1 of the upper surface 222a of the upper pad 222 may be greater than the horizontal length L2 of the lower surface 222b, e.g., by 0.5 to 2 μm.

The lower pad 224 may be in the first passivation layer 212 and the second passivation layer 214. A portion of the lower pad 224 may be in the first passivation layer 212, and the remaining portion of the lower pad 224 may be in the second passivation layer 214. The lower pad 224 may be connected to the upper pad 222. The lower pad 224 may include an upper surface 224a at or adjacent to a lower portion of the first passivation layer 212, a lower surface 224b at or aligned with a middle portion of the second passivation layer 214, and a side surface 224c connecting corresponding ones of opposite ends of the upper surface 224a and opposite ends of the lower surface 224b. A horizontal length L3 of the upper surface 224a of the lower pad 224 may be greater than a horizontal length L4 of the lower surface 224b. The upper surface 224a of the lower pad 224 may contact (e.g., directly contact) the lower surface 222b of the upper pad 222. The horizontal length L3 of the upper surface 224a of the lower pad 224 may be smaller than the horizontal length L2 of the lower surface 222b of the upper pad 222. In an implementation, the horizontal length L3 of the upper surface 224a of the lower pad 224 may be smaller than the horizontal length L2 of the lower surface 222b of the upper pad 222, e.g., by 8 to 12 μm.

In an implementation, a sum of a height h1 of the upper pad 222 and a height h2 of the lower pad 224 may be 8 to 12 Each of the height h1 of the upper pad 222 and the height h2 of the lower pad 224 may be 1 to 11 μm.

The seed layer 230 may be between the passivation layer 210 and the UBM pad 220. The seed layer 230 may cover a side surface of the UBM pad 220 and may partially cover a lower surface of the UBM pad 220. In an implementation, the seed layer 230 may include a first seed part 232, a second seed part 234, a third seed part 236, and a fourth seed part 238. The first seed part 232 may be between the first passivation layer 212 and the side surface 222c of the upper pad 222. An upper surface of the first seed part 232 may be aligned with the upper surface 222a of the upper pad 222. In an implementation, a width W1 of the first seed part 232 may be 50 to 200 nm. A height h3 of the first seed part 232 may be equal to the height h1 of the upper pad 222.

The second seed part 234 may be between a lower surface of the first passivation layer 212 and the lower surface 222b of the upper pad 222 (e.g., may be between the upper surface of the second passivation layer 214 and the lower surface 222b of the upper pad 222). The second seed part 234 may extend from the opposite ends of the lower surface 222b of the upper pad 222 to the corresponding opposite ends of the upper surface 224a of the lower pad 224. The second seed part 234 may cover at least a portion of the lower surface 222b of the upper pad 222. In an implementation, a horizontal length L5 of the second seed part 234 may be 4 to 6 μm, and a height h4 of the second seed part 234 may be 50 to 200 nm.

The third seed part 236 may be between the second passivation layer 214 and the side surface 224c of the lower pad 224. The third seed part 236 may extend from an inner end of the second seed part 234 along the side surface 224c of the lower pad 224. In an implementation, a width W2 of the third seed part 236 may be 50 to 200 nm. A sum of the height h4 of the second seed part 234 and a height h5 of the third seed part 236 may be equal to the height h2 of the lower pad 224.

The fourth seed part 238 may extend inwardly from opposite ends of a lower surface or end of the third seed part 236. A void surrounded or defined by the second passivation layer 214, the lower pad 224, the fourth seed part 238, and the external connecting terminal 250 may be inside the fourth seed part 238. The fourth seed part 238 may surround or cover at least a portion of the lower surface 224b of the lower pad 224. A horizontal length L6 from an inner end of an upper surface of the fourth seed part 238 to the opposite ends of the lower surface 224b of the lower pad 224 may be smaller than a horizontal length L7 from the opposite ends of the lower surface 224b of the lower pad 224 to the external connecting terminal 250 (e.g., a point where the external connecting terminal 250 contacts the lower surface 224b of the lower pad 224). In an implementation, the horizontal length L6 from the inner end of the upper surface of the fourth seed part 238 to the opposite ends of the lower surface 224b of the lower pad 224 may be 1 to 3 μm, and the horizontal length L7 from the opposite ends of the lower surface 224b of the lower pad 224 to the external connecting terminal 250 may be 4 to 6 μm. In an implementation, a height h6 of the fourth seed part 238 may be equal to the height h4 of the second seed part 234. The seed layer 230 may include Ti. In an implementation, the seed layer 230 may include, e.g., Ti, $TiO_2$, CrN, TiCN, or TiAlN.

The UBM via 240 may be on the UBM pad 220. The UBM via 240 may extend through the first passivation layer 212 and, may electrically interconnect the third redistribution pattern 134c and the UBM pad 220. The UBM via 240 may be a conductive via.

The external connecting terminal 250 may be on or at a lower surface of the passivation layer 210. The external connecting terminal 250 may be in a groove in the second passivation layer 214. The external connecting terminal 250 may contact (e.g., directly contact) the lower surface of the UBM pad 220. The external connecting terminal 250 may be electrically connected to the lower redistribution layer 130 through the UBM pad 220. The external connecting terminal 250 may be a solder ball or a solder bump.

The encapsulation layer 140 may be on the lower redistribution layer 130. The encapsulation layer 140 may fill a space between the connection layer 110 and the plurality of semiconductor chips 120 and a space between adjacent ones of the plurality of semiconductor chips 120. In an implementation, the encapsulation layer 140 may include an insulating material such as an ABF.

The upper redistribution layer 150 may be on the connection layer 110. A side wall of the upper redistribution layer 150 may be aligned with a side wall of the connection layer 110. The upper redistribution layer 150 may include an insulating layer 152, a redistribution pattern 154, and a conductive via 156. The insulating layer 152 may include a first insulating layer 152a contacting an upper surface of the connection layer 110, top surfaces of the plurality of semiconductor chips 120, and an upper surface of the encapsulation layer 140, a second insulating layer 152b on an upper surface of the first insulating layer 152a, and a third insulating layer 152c on an upper surface of the second insulating layer 152b.

The redistribution pattern 154 may include a first redistribution pattern 154a buried in the second insulating layer 152b, a second redistribution pattern 154b on a lower surface of the third insulating layer 152c, and a third redistribution pattern 154c on an upper surface of the third insulating layer 152c.

The conductive via 156 may include a first conductive via 156a electrically interconnecting the first conductive pad 116a and the first redistribution pattern 154a, a second conductive via 156b electrically interconnecting the first redistribution pattern 154a and the second redistribution pattern 154b, and a third conductive via 156c electrically interconnecting the second redistribution pattern 154b and the third redistribution pattern 154c.

The upper passivation layer 160 may be on the upper redistribution layer 150. A lower surface of the upper passivation layer 160 may contact (e.g., directly contact) an upper surface of the upper redistribution layer 150. The upper passivation layer 160 may include a groove 162 having a greater width at an upper portion thereof than at a lower portion thereof. In an implementation, the upper passivation layer 160 may include PID.

Figure 3:
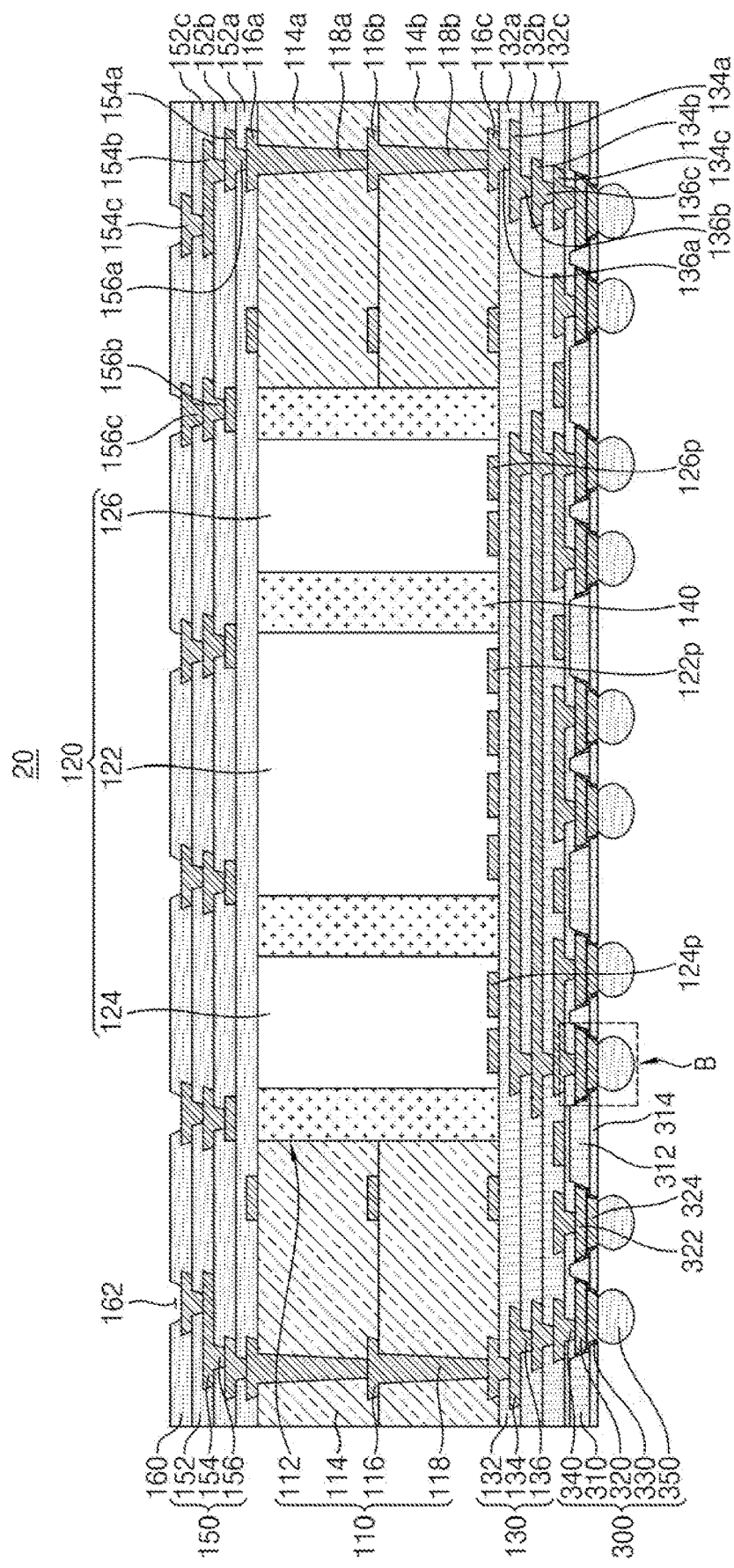
FIG. 3 is a sectional view of a semiconductor package according to an exemplary embodiment of the disclosure.
Figure 4:
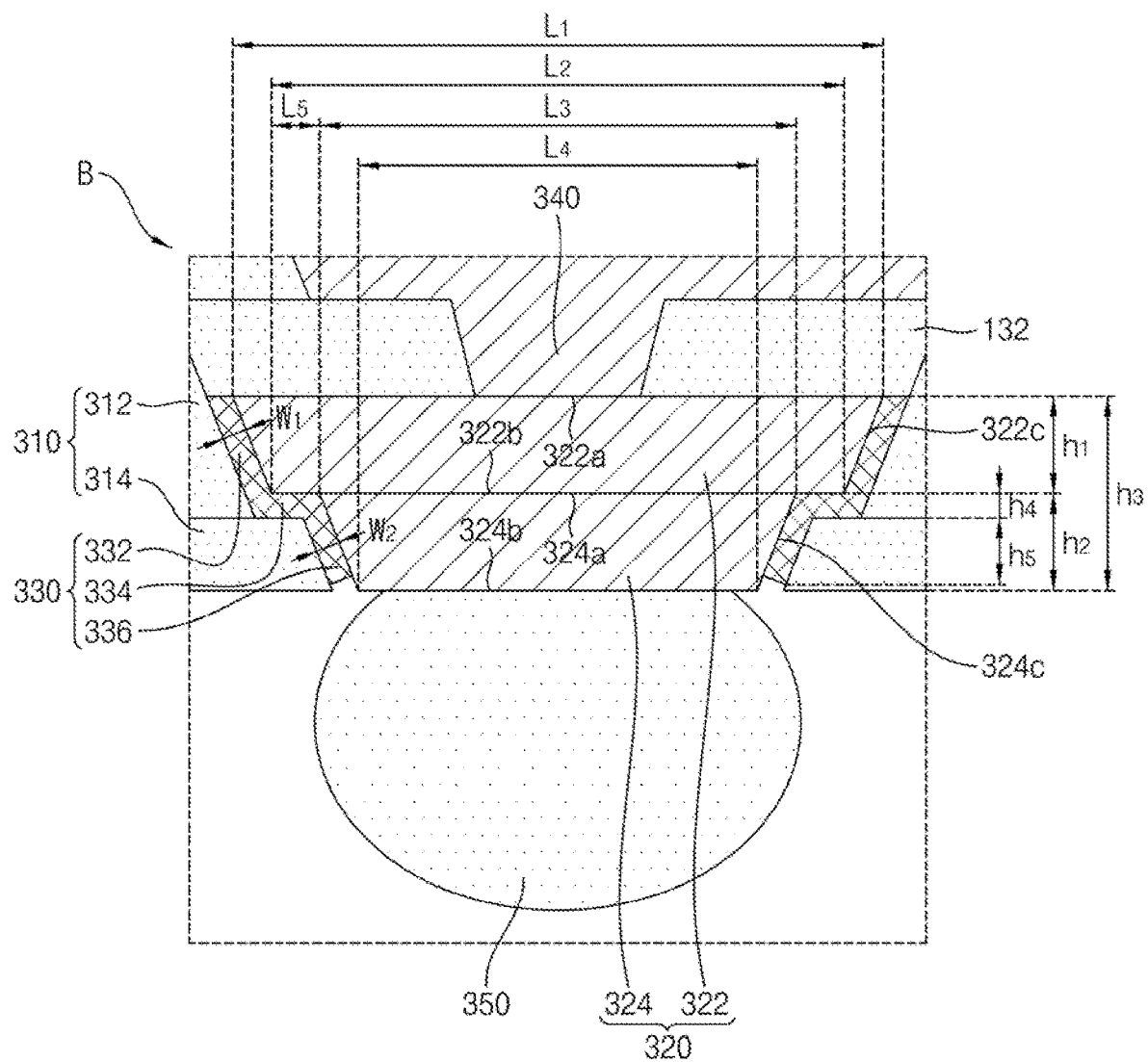
FIG. 4 is an enlarged view of a portion B in FIG. 3.

FIG. 3 is a sectional view of a semiconductor package according to an exemplary embodiment of the disclosure. FIG. 4 is an enlarged view of a portion B in FIG. 3.

Referring to FIG. 3, a semiconductor package 20 may include a connection layer 110, a plurality of semiconductor chips 120, a lower redistribution layer 130, a UBM layer 300, an encapsulation layer 140, an upper redistribution layer 150, and an upper passivation layer 160.

The UBM layer 300 may include a lower passivation layer 310, a UBM pad 320, a seed layer 330, a UBM via 340, and an external connecting terminal 350. The UBM via 340 and the external connecting terminal 350 may be identical to the UBM via 240 and the external connecting terminal 250 of FIGS. 1 and 2, respectively.

The lower passivation layer 310 may include a first passivation layer 312 and a second passivation layer 314. The lower passivation layer 310 may be identical to the lower passivation layer 210 of FIGS. 1 and 2, except that the height of the first passivation layer 312 may be greater than the height of the second passivation layer 314.

The UBM pad 320 may include an upper pad 322 and a lower pad 324. The UBM pad 320 may be identical to the UBM pad 220 of FIGS. 1 and 2, except that a lower surface of the lower pad 324 may be coplanar with a lower surface of the lower passivation layer 310.

The seed layer 330 may include a first seed part 332, a second seed part 334, and a third seed part 336. The first seed part 332 and the second seed part 334 may be identical to the first seed part 232 and the second seed part 234 of FIGS. 1 and 2, respectively. The third seed part 336 may be between the second passivation layer 314 and a side surface 324c of the lower pad 324. The third seed part 336 may extend from an inner end of the second seed part 334 along the side surface 324c of the lower pad 324. A void surrounded or defined by the second passivation layer 314, the lower pad 324 and the third seed part 336 may be under (e.g., at an end of) the third seed part 336. A sum of a height h4 of the second seed part 334 and a height h5 of the third seed part 336 may be smaller than a height h2 of the lower pad 324. In an implementation, the sum of the height h4 of the second seed part 334 and the height h5 of the third seed part 336 may be 30 to 80% of the height h2 of the lower pad 324.

Figure 5:
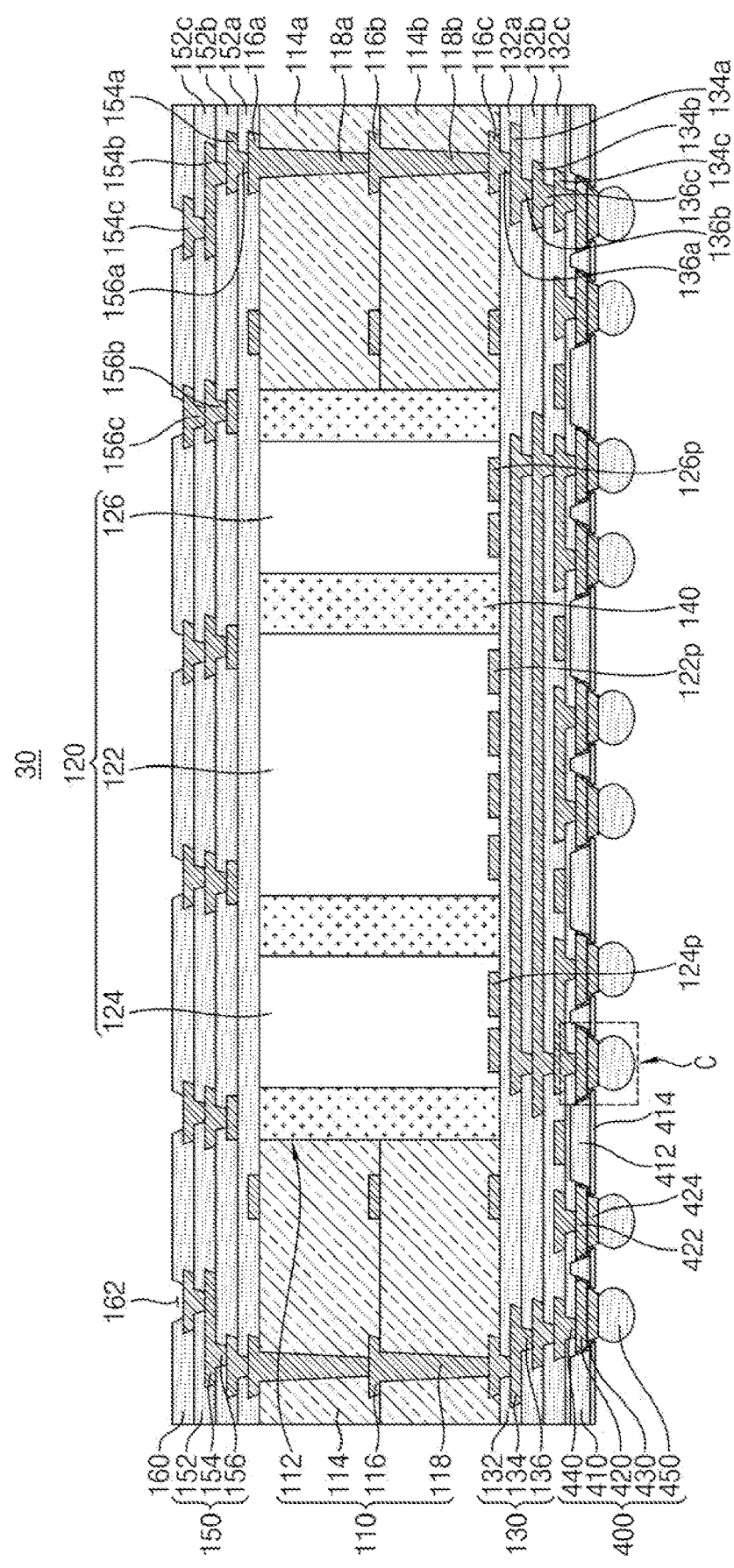
FIG. 5 is a sectional view of a semiconductor package according to an exemplary embodiment of the disclosure.
Figure 6:
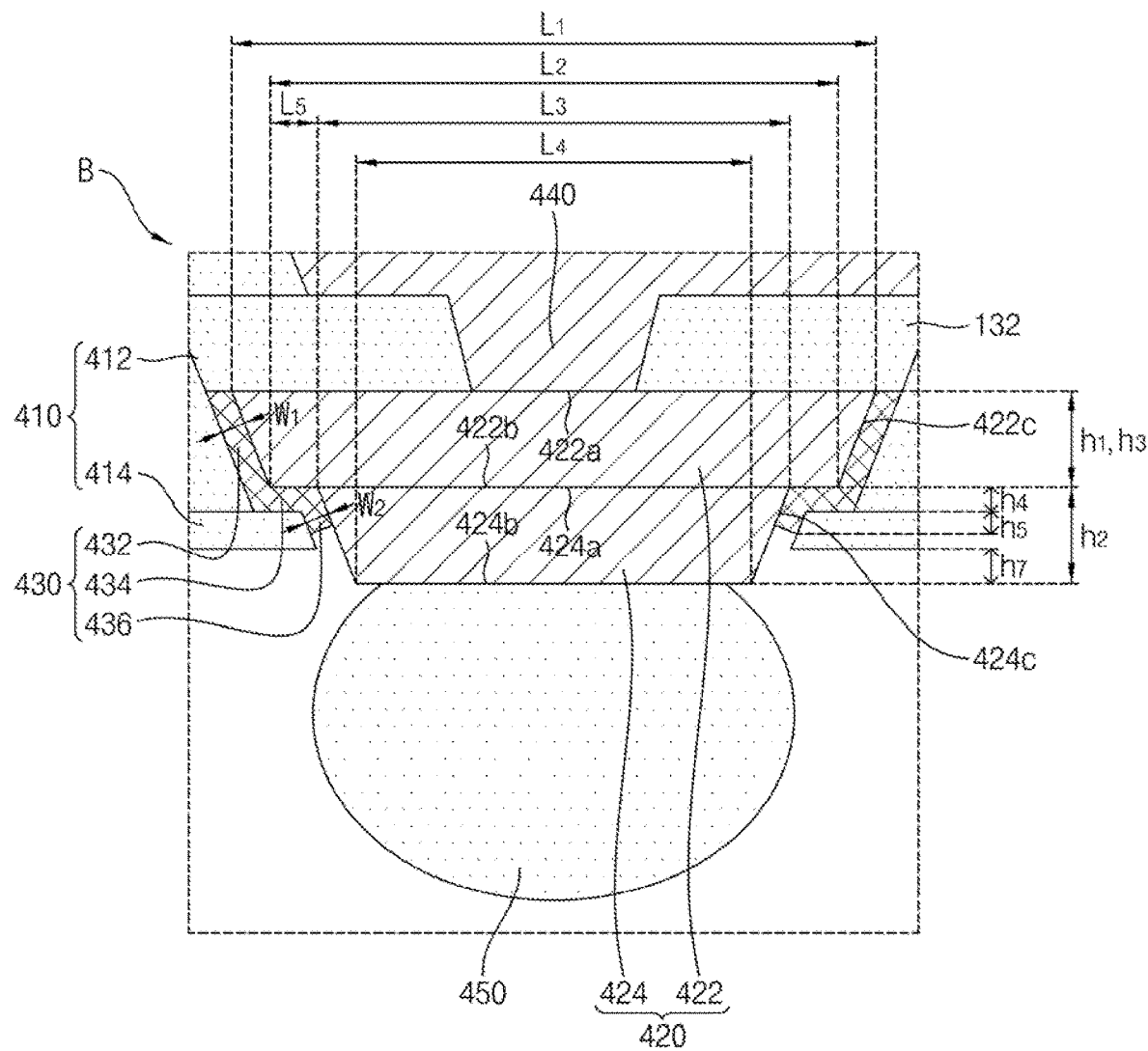
FIG. 6 is an enlarged view of a portion C in FIG. 5.

FIG. 5 is a sectional view of a semiconductor package according to an exemplary embodiment of the disclosure. FIG. 6 is an enlarged view of a portion C in FIG. 5.

Referring to FIG. 5, a semiconductor package 30 may include a connection layer 110, a plurality of semiconductor chips 120, a lower redistribution layer 130, a UBM layer 400, an encapsulation layer 140, an upper redistribution layer 150, and an upper passivation layer 160.

The UBM layer 400 may include a lower passivation layer 410, a UBM pad 420, a seed layer 430, a UBM via 440, and an external connecting terminal 450. The lower passivation layer 410, the UBM via 440 and the external connecting terminal 450 may be identical to the lower passivation layer 310, the UBM via 340 and the external connecting terminal 350 of FIGS. 3 and 4, respectively.

The UBM pad 420 may include an upper pad 422 and a lower pad 424. The upper pad 422 may be identical to the upper pad 322 of FIGS. 3 and 4. The lower pad 424 may be identical to the lower pad 324 of FIGS. 3 and 4, except that a lower portion of the lower pad 424 may protrude under (e.g., outwardly or downwardly beyond) a lower surface of the second passivation layer 414. In an implementation, a vertical length h7 between a lower surface 424b of the lower pad 424 and the lower surface of the second passivation layer 414 may be 0.8 to 10 μm.

The seed layer 430 may include a first seed part 432, a second seed part 434, and a third seed part 436. The first seed part 432 and the second seed part 434 may be identical to the first seed part 332 and the second seed part 334 of FIGS. 3 and 4, respectively. The third seed part 436 may be between the second passivation layer 414 and a side surface 424c of the lower pad 424. The third seed part 436 may extend from an inner end of the second seed part 434 along a side surface 424c of the lower pad 424. A void surrounded by the second passivation layer 414, the lower pad 424, and the third seed part 436 may be under (e.g., at an end of) the third seed part 436. A sum of a height h4 of the second seed part 434 and a height h5 of the third seed part 436 may be smaller than a height h2 of the lower pad 424. In an implementation, the sum of the height h4 of the second seed part 434 and the height h5 of the third seed part 436 may be 10 to 60% of the height h2 of the lower pad 424.

FIGS. 7 to 16 are sectional views of stages in a method for manufacturing a semiconductor package in accordance with an exemplary embodiment of the disclosure.

Figure 7:
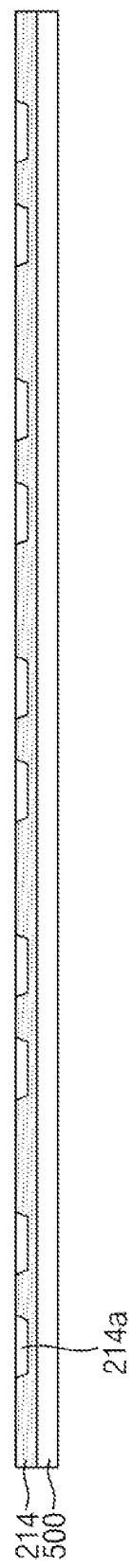
FIGS. 7 to 16 are sectional views of stages in a method for manufacturing a semiconductor package in accordance with an exemplary embodiment of the disclosure.

Referring to FIG. 7, a second passivation layer 214 may be formed on an asymmetrical carrier 500. The second passivation layer 214 may be formed by coating a PID material on an upper surface of the asymmetrical carrier 500, and subjecting the coated PID material to light exposure and development. The second passivation layer 214 may include a groove 214a.

Figure 8:
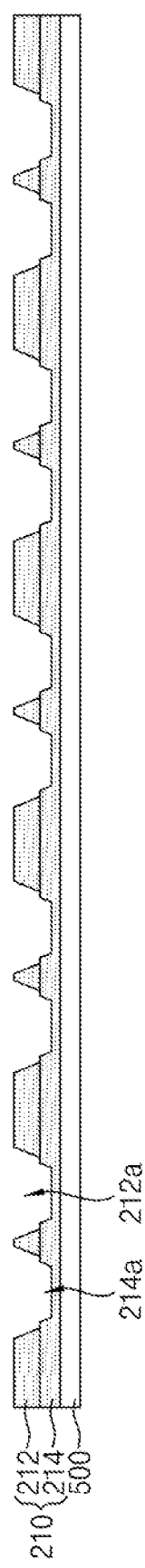

Referring to FIG. 8, a first passivation layer 212 may be formed on the second passivation layer 214. The first passivation layer 212 may be formed by coating a PID material on an upper surface of the second passivation layer 214, and subjecting the coated PID material to light exposure and development. The first passivation layer 212 may include a groove 212a. The width of the groove 212a of the first passivation layer 212 may be greater than the width of the groove 214a of the second passivation layer 214.

Figure 9:
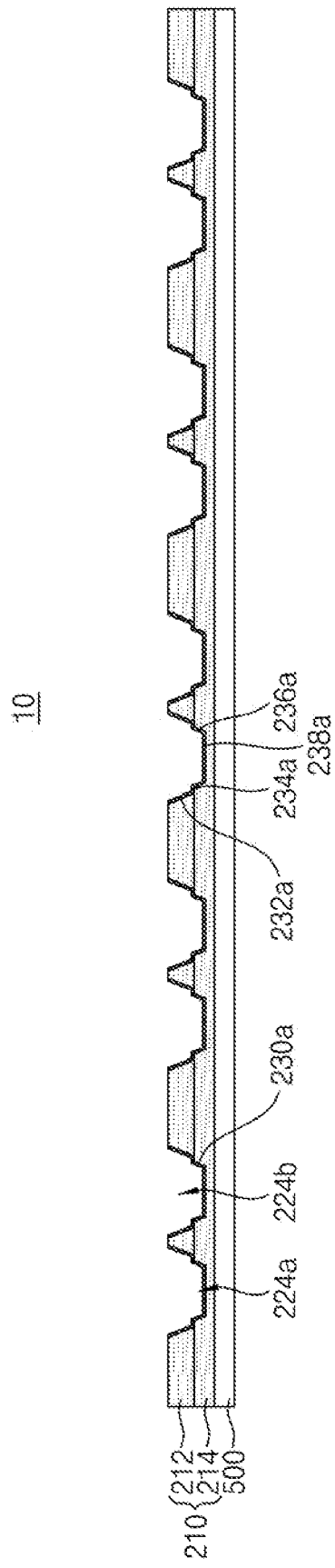

Referring to FIG. 9, a seed layer 230a may be formed on the first passivation layer 212 and the second passivation layer 214. The seed layer 230a may be formed to extend continuously from an upper end of an inner side surface of the first passivation layer 212 to a horizontal surface of a lower horizontal surface of the second passivation layer 214. The seed layer 230a may be formed through a sputtering process. The seed layer 230a may cover inner portions of the first passivation layer 212 and the second passivation layer 214. The seed layer 230a may include a first seed part 232a on the inner side surface of the first passivation layer 212, a second seed part 234a on an inner lower surface of the first passivation layer 212, a third seed part 236a on an inner side surface of the second passivation layer 214, and a fourth seed part 238a on the lower horizontal surface of the second passivation layer 214. An upper surface of the first seed part 232a may be aligned with an upper surface of the first passivation layer 212.

Figure 10:
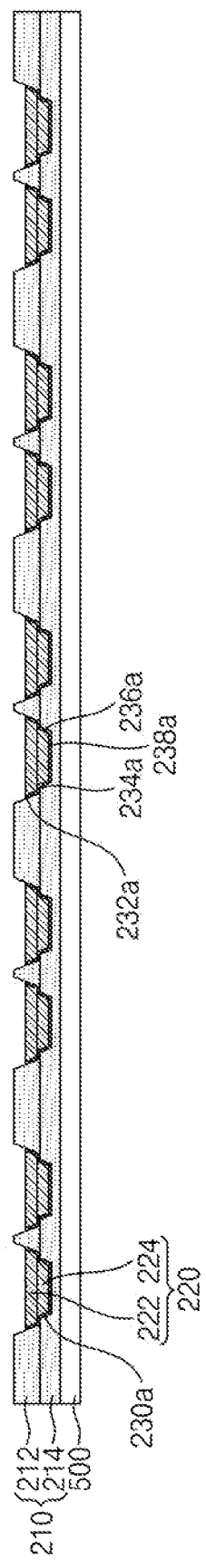

Referring to FIG. 10, a UBM pad 220 may be formed on the first passivation layer 212 and the second passivation layer 214. The UBM pad 220 may be formed through a plating process. In an implementation, the plating process may be electroplating. The UBM pad 220 may cover at least a portion of the first seed part 232a, and may cover entireties of the second seed part 234a, the third seed part 236a and the fourth seed part 238a. Thereafter, a portion of the first seed part 232a, which is not covered by the UBM pad 220, may be removed. In an implementation, the portion of the first seed part 232a not covered by the UBM pad 220 may be removed through an etching process. In an implementation, the etching process may be an over-etching process or a just-etching process. In an implementation, when an over-etching process is performed, a void surrounded by the first passivation layer 212, the UBM pad 220 and the first seed part 232a may be formed at an upper portion of the first seed part 232a.

Figure 11:
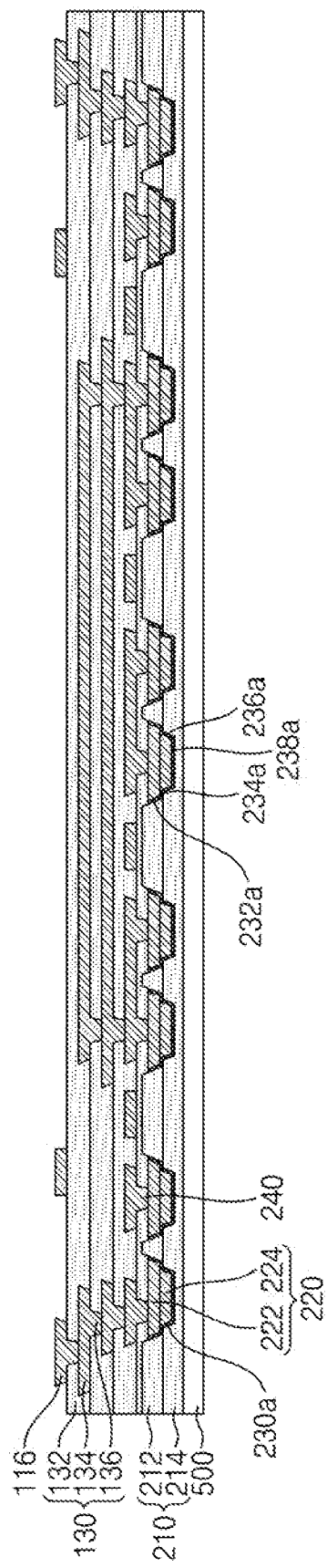

Referring to FIG. 11, a lower redistribution layer 130 may be formed on the first passivation layer 212. The lower redistribution layer 130 may be formed through repetition of forming an insulating layer 132, forming a conductive via 136 extending through the insulating layer 132 and forming a redistribution pattern 134 on the insulating layer 132 and the conductive via 136.

Figure 12:
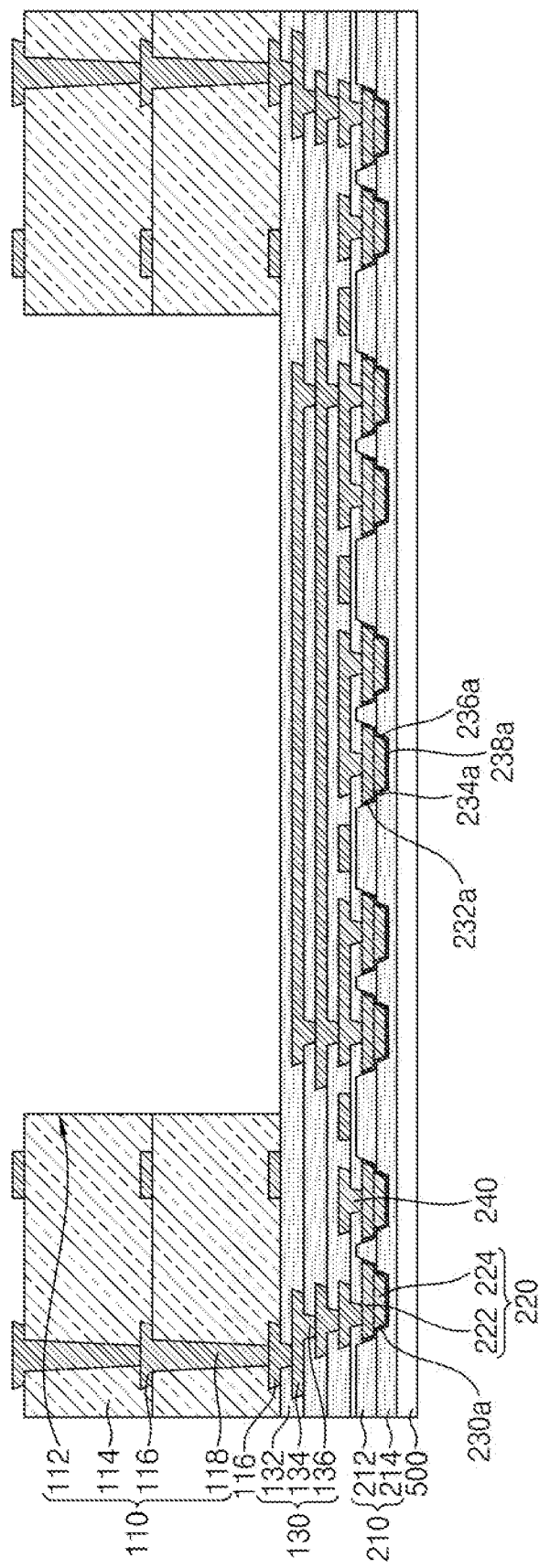

Referring to FIG. 12, a connection layer 110 may be formed on the lower redistribution layer 130. The connection layer 110 may be formed through a method of forming a plurality of cores 114 at one side and the other side of the lower redistribution layer 130, forming a cavity 112 between the plurality of cores 114, forming a conductive via 118 extending through each of the plurality of cores 114, and forming a conductive pad 116 on the core 114 and the conductive via 118.

Figure 13:
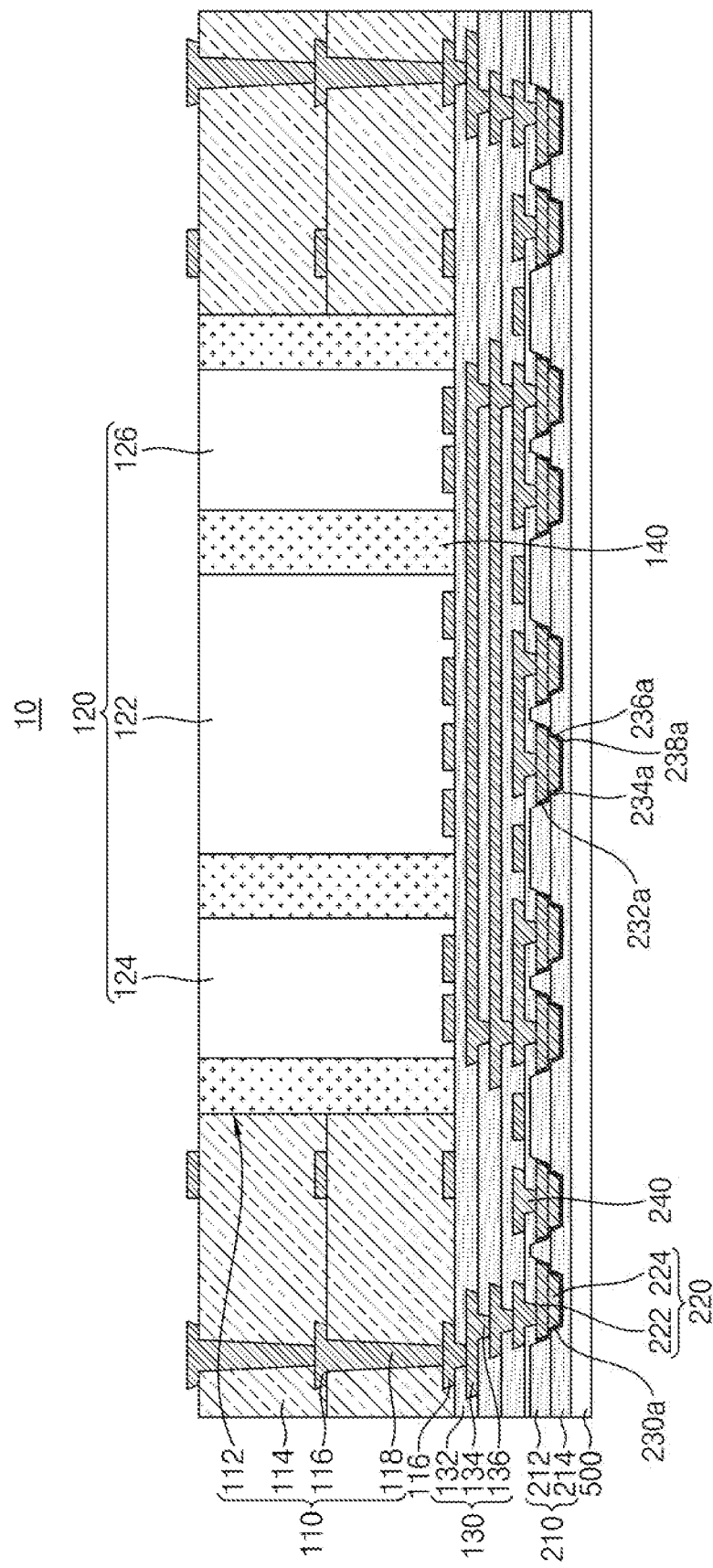

Referring to FIG. 13, a plurality of semiconductor chips 120 may be disposed in the cavity 112. Bottom surfaces of the plurality of semiconductor chips 120 may contact an upper surface of the lower redistribution layer 130. Thereafter, an encapsulation layer 140 may be formed in a space between the connection layer 110 and the plurality of semiconductor chips 120 and a space between adjacent ones of the plurality of semiconductor chips 120.

Figure 14:
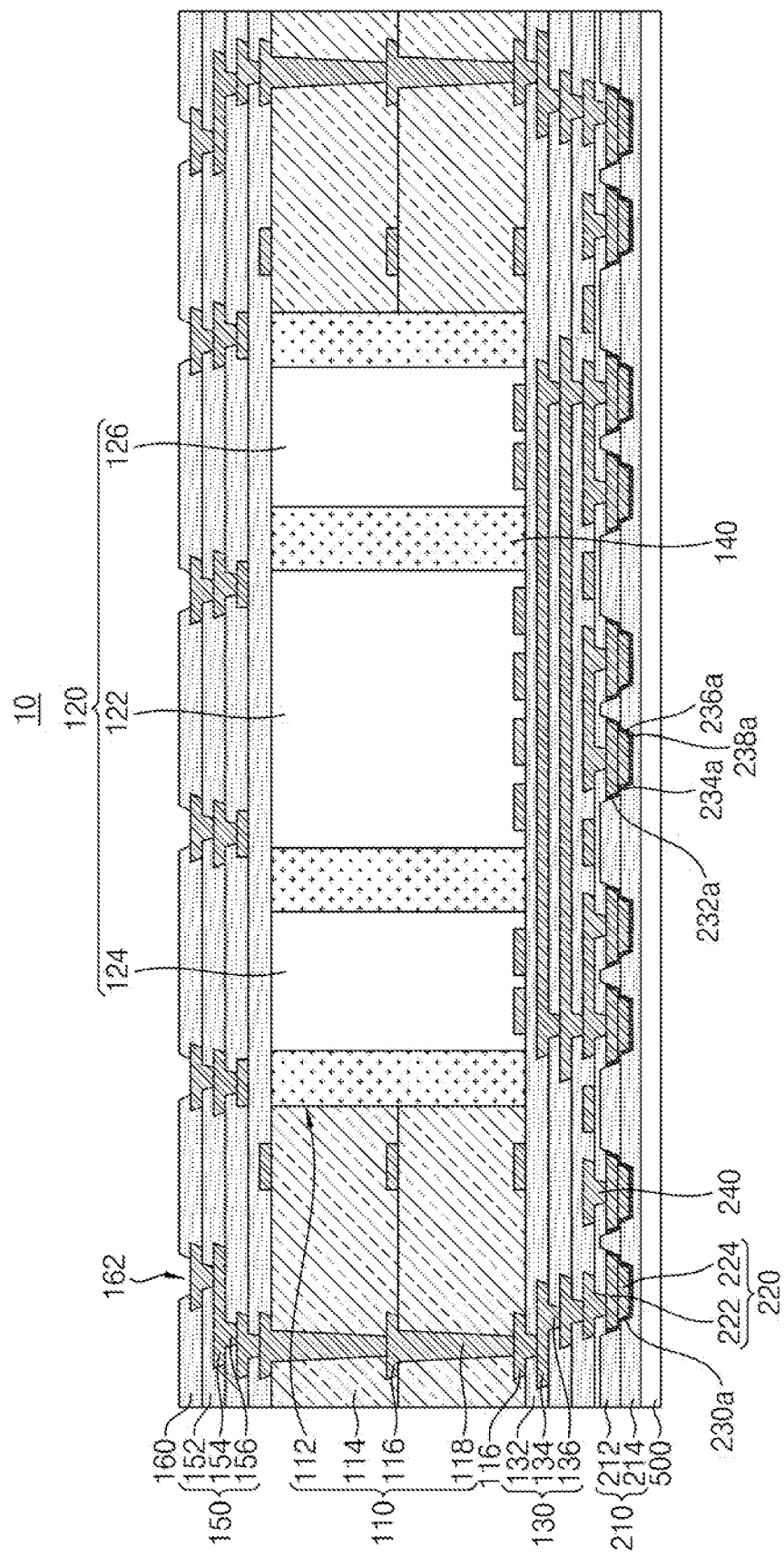

Referring to FIG. 14, an upper redistribution layer 150 may be formed on the connection layer 110, the plurality of semiconductor chips 120 and the encapsulation layer 140. The upper redistribution layer 150 may be formed through repetition of forming an insulating layer 152, forming a conductive via 156 extending through the insulating layer 152 and forming a redistribution pattern 154 on the insulating layer 152 and the conductive via 156. Subsequently, an upper passivation layer 160 may be formed on the upper redistribution layer 150. The upper passivation layer 160 may be formed by coating a PID material on an upper surface of the upper redistribution layer 150, and subjecting the coated PID material to light exposure and development. The upper passivation layer 160 may include a groove 162.

Figure 15:
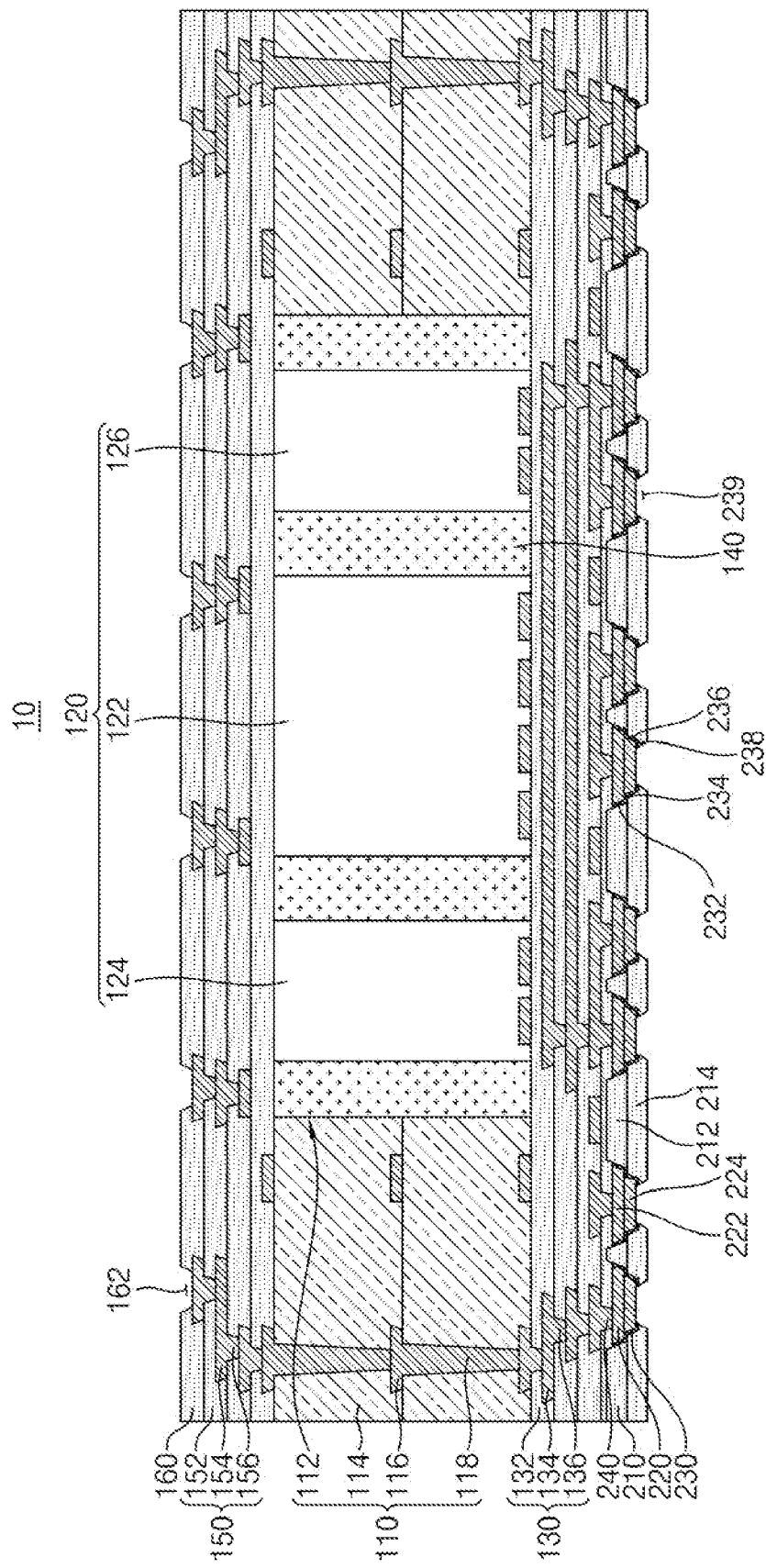
Figure 16:
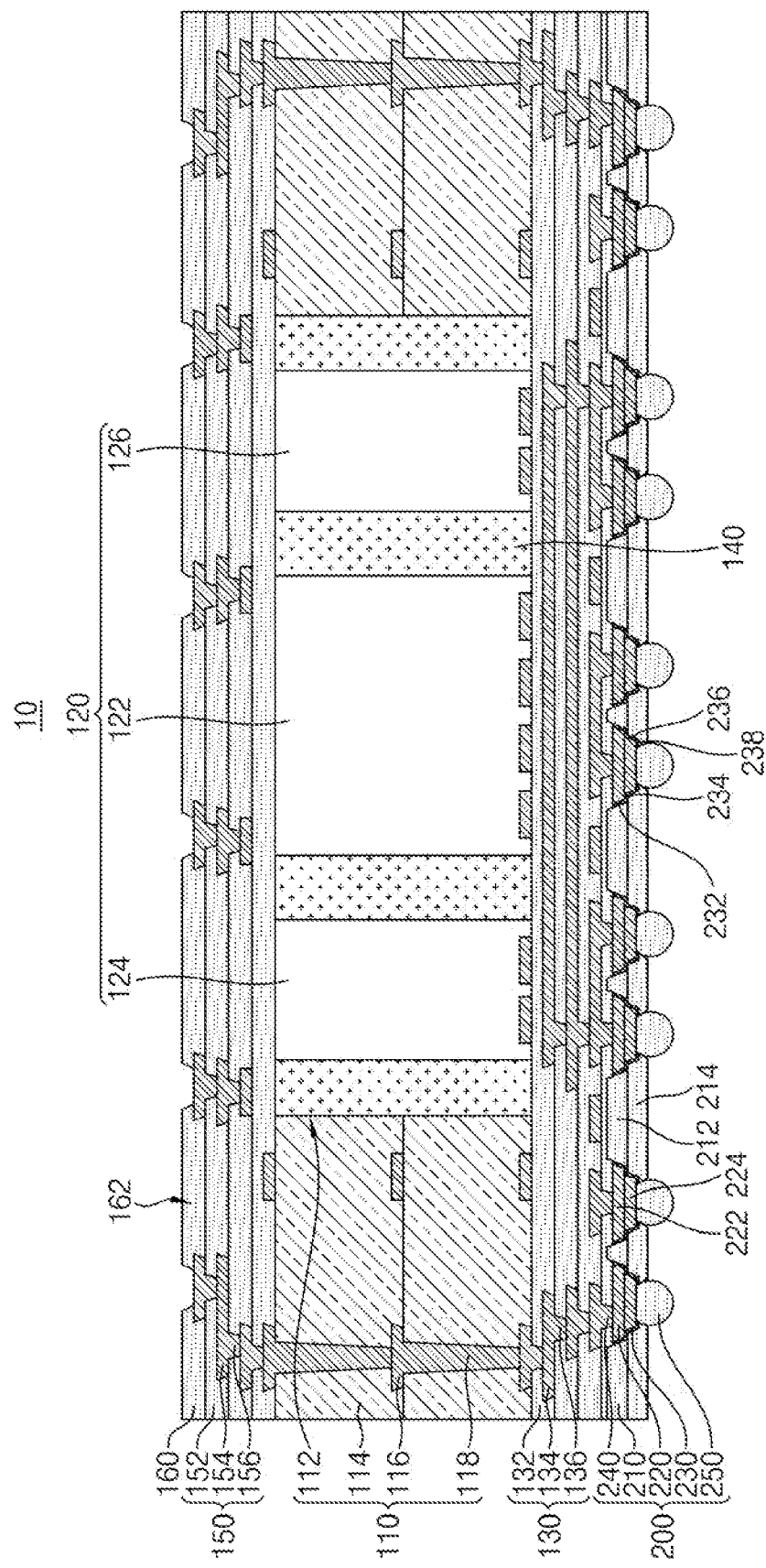

Referring to FIGS. 15 and 16, an external connecting terminal 250 may be formed at a lower surface of the second passivation layer 214. The asymmetrical carrier 500 on the lower surface of the second passivation layer 214 may be removed. A groove 239 may then be formed by performing a vertical etching process from the lower surface of the second passivation layer 214 to the fourth seed part 238. In an implementation, the vertical etching process may be a laser ablation process or a plasma etching process, and may be performed in such a manner that the plasma etching process is executed after execution of the laser ablation process.

During the vertical etching process for the second passivation layer 214, a horizontal etching process may also be performed on the fourth seed part 238 such that a lower surface of a lower pad 224 of the UBM pad 220 is exposed. In an implementation, the horizontal etching process may be an over-etching process or a just-etching process. When the over-etching process is performed, an undercut for the fourth seed part 238 may be formed and, as such, a void surrounded by the second passivation layer 214, the lower pad 224, the fourth seed part 238, and an external connecting terminal 250 (FIG. 16) may be formed after subsequent formation of the external connecting terminal 250.

When the just etching process is performed, the inner side surface of the second passivation layer 214 and the inner side surface of the fourth seed part 238 may be aligned with each other. After execution of the just etching process, a descum process may be performed and, as such, a void surrounded by the second passivation layer 214, the lower pad 224, and the external connecting terminal 250 may be formed.

Referring to FIG. 16, the external connecting terminal 250 may be formed on an exposed lower surface of the lower pad 224. Thus, a semiconductor package 10 may be manufactured.

When the semiconductor package 10 is the semiconductor package 20 of FIGS. 3 and 4, a vertical etching process may be performed until the lower surface of the second passivation layer 214 becomes coplanar with a lower surface of the lower pad 224. During execution of the vertical etching process, the fourth seed part 238 may be removed, and a void surrounded by the second passivation layer 214, the lower pad 224 and the third seed part 236 may be formed under the third seed part 236.

When the semiconductor package 10 is the semiconductor package 20 of FIGS. 5 and 6, a vertical etching process may be performed until a lower portion of the lower pad 224 protrudes from the lower surface of the second passivation layer 214. During the vertical etching process, the fourth seed part 238 may be removed, and a void surrounded by the second passivation layer 214, the lower pad 224 and the third seed part 236 may be formed under the third seed part 236.

Figure 17:
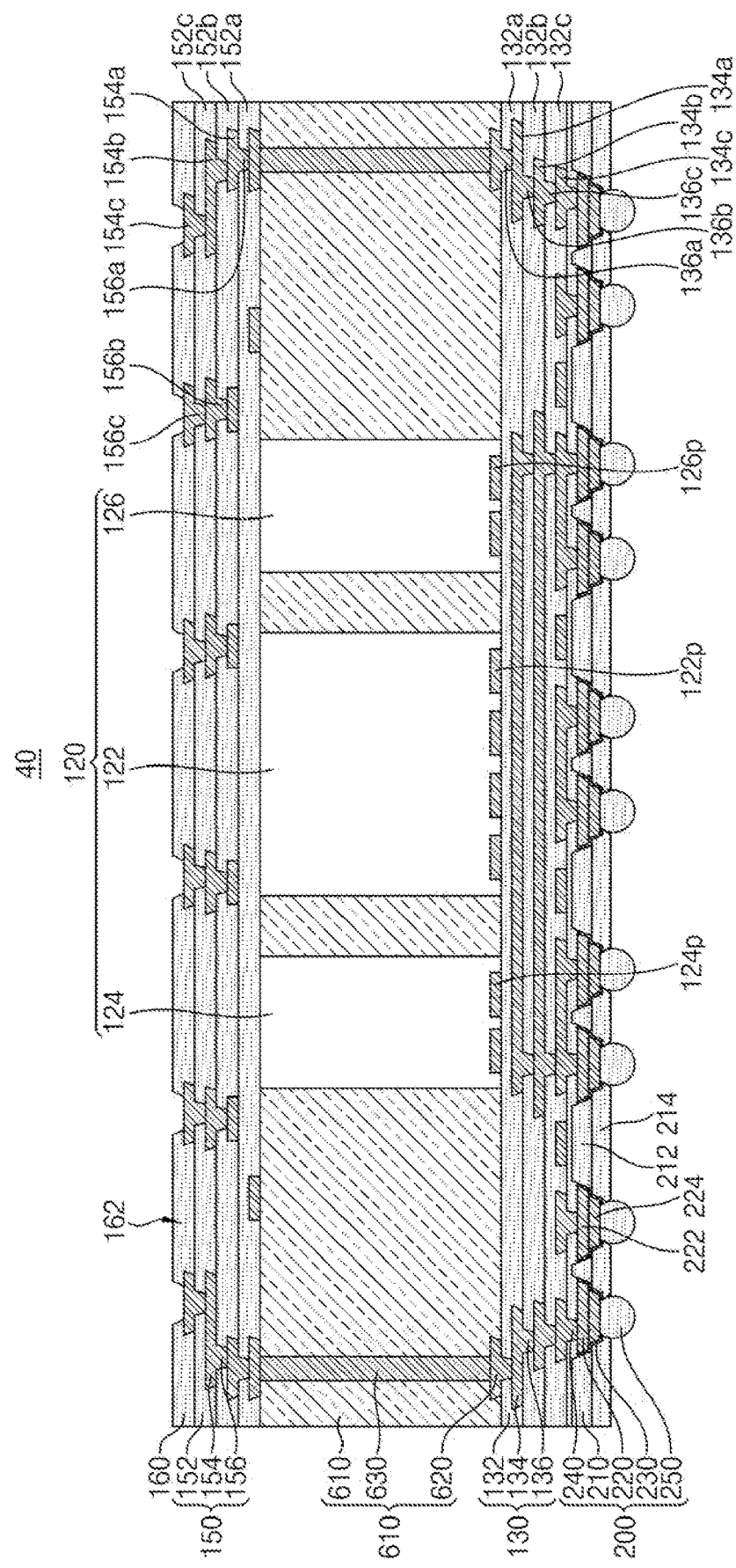
FIG. 17 is a sectional view of a semiconductor package according to an exemplary embodiment of the disclosure.

FIG. 17 is a sectional view of a semiconductor package according to an exemplary embodiment of the disclosure.

Referring to FIG. 17, a semiconductor package 40 may include an encapsulation layer 600, a plurality of semiconductor chips 120, a lower redistribution layer 130, a UBM layer 200, an encapsulation layer 140, an upper redistribution layer 150, and an upper passivation layer 160. The encapsulation layer 600 may include a molding part 610, a conductive pad 620, and a conductive via 630. The molding part 610 may be on the lower redistribution layer 130. The molding part 610 may contact an upper surface of the lower redistribution layer 130 at a lower surface of the molding part 610 and may contact a lower surface of the upper redistribution layer 150 at an upper surface of the molding part 610. A side surface of the molding part 610 may be aligned with a side surface of the lower redistribution layer 130 and a side surface of the upper redistribution layer 150. The molding part 610 may cover the lower redistribution layer 130, and may cover side surfaces of the plurality of semiconductor chips 120 while filling a space between adjacent ones of the plurality of semiconductor chips 120. In an implementation, the molding part 610 may include an epoxy molding compound (EMC), a thermoplastic resin such as polyimide, or a resin formed by including a reinforcement such as an inorganic filler in the EMC or the thermoplastic resin, in detail, an Ajinomoto build-up film (ABF), FR-4, bismaleimide triazine (BT), or the like. A molding material such as an EMC or a photosensitive material such as a photo-imagable encapsulant (PIE) may be used.

The conductive pad 620 may be at a lower portion of the molding part 610. The conductive pad 620 may be electrically connected to a first redistribution pattern 134a through a first conductive via 136a.

The conductive via 630 may be at or adjacent to opposite sides or ends of the molding part 610. The conductive via 630 may extend through the molding part 610 in a vertical direction. The conductive via 630 may electrically interconnect a first redistribution pattern 154a and the conductive pad 620.

By way of summation and review, when a UBM pad is formed using a SAP process, the UBM pad may react with oxygen of a resin and, as such, an oxide film may be produced. As a result, cracks may be generated, thereby causing issues with reliability.

In accordance with the exemplary embodiments of the disclosure, the semiconductor package may include a seed part including Ti and may achieve an enhancement in reliability.

In accordance with the exemplary embodiments of the disclosure, the semiconductor package may include a UBM pad having a stepped shape and may achieve an enhancement in reliability.

In accordance with the exemplary embodiments of the disclosure, a horizontal etching process may be performed for a seed layer and the resultant semiconductor package may achieve an enhancement in reliability.

One or more embodiments may provide a semiconductor package achieving an enhancement in reliability.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor package, comprising:
a semiconductor chip;
a lower redistribution layer on a lower surface of the semiconductor chip;
a lower passivation layer on a lower surface of the lower redistribution layer;
an under bump metallization (UBM) pad on the lower passivation layer, the UBM pad including an upper pad and a lower pad connected to the upper pad, the upper pad having a greater horizontal length between outermost edges of an entire uppermost surface thereof than a horizontal length between outermost edges of an entire lowermost surface thereof, the uppermost surface vertically overlapping the lowermost surface, and the upper pad being between the lower pad and the lower redistribution layer;
a seed layer between the lower passivation layer and the UBM pad; and
an external connecting terminal on a lower surface of the UBM pad,
wherein the seed layer includes:
a first seed part covering a side surface of the upper pad,
a second seed part covering at least a portion of the lower surface of the upper pad, and
a third seed part covering at least a portion of a side surface of the lower pad.

2. The semiconductor package as claimed in claim 1, wherein a height of the UBM pad is 8 μm to 12 μm.

3. The semiconductor package as claimed in claim 1, wherein the seed layer further includes a fourth seed part covering a portion of a lower surface of the lower pad.

4. The semiconductor package as claimed in claim 3, further comprising a void surrounded by the lower passivation layer, the lower pad, the fourth seed part, and the external connecting terminal inside the fourth seed part.

5. The semiconductor package as claimed in claim 3, wherein a horizontal length from an inner end of an upper surface of the fourth seed part to opposite ends of the lower surface of the lower pad is smaller than a horizontal length from the opposite ends of the lower surface of the lower pad to a point at which the external connecting terminal contacts the lower surface of the lower pad.

6. The semiconductor package as claimed in claim 5, wherein the horizontal length from the inner end of the upper surface of the fourth seed part to the opposite ends of the lower surface of the lower pad is 1 μm to 3 μm.

7. The semiconductor package as claimed in claim 5, wherein the horizontal length from the opposite ends of the lower surface of the lower pad to the point at which the external connecting terminal contacts the lower surface of the lower pad is 4 μm to 6 μm.

8. The semiconductor package as claimed in claim 1, wherein a lower surface of the lower pad is coplanar with a lower surface of the lower passivation layer.

9. The semiconductor package as claimed in claim 8, wherein a sum of a height of the second seed part and a height of the third seed part is 30 to 80% of a height of the lower pad.

10. The semiconductor package as claimed in claim 1, wherein a lower portion of the lower pad protrudes downwardly beyond a lowermost portion of the lower passivation layer.

11. The semiconductor package as claimed in claim 10, wherein a height of the second seed part and a height of the third seed part are 10 to 60% of a height of the lower pad.

12. The semiconductor package as claimed in claim 1, wherein the seed layer includes Ti, $TiO_2$, CrN, TiCN, or TiAlN.

13. A semiconductor package, comprising:
a semiconductor chip;
a lower redistribution layer on a lower surface of the semiconductor chip, the lower redistribution layer including a lower insulating layer and a lower wiring pattern;
an encapsulation layer covering the semiconductor chip and the lower redistribution layer;
a lower passivation layer on a lower surface of the lower redistribution layer;

an under bump metallization (UBM) pad in the lower passivation layer, the UBM pad including an upper pad and a lower pad connected to the upper pad, the upper pad having a greater horizontal length between outermost edges of an entire uppermost surface thereof than a horizontal length between outermost edges of an entire lowermost surface thereof, the uppermost surface vertically overlapping the lowermost surface, and the upper pad being between the lower pad and the lower redistribution layer;

a seed layer between the lower passivation layer and the UBM pad;

an external connecting terminal on a lower surface of the UBM pad, the external connecting terminal being configured to electrically interconnect the UBM pad to an exterior;

a UBM via on the lower passivation layer, the UBM via electrically interconnecting the lower redistribution layer and the UBM pad;

an upper redistribution layer on an upper surface of the semiconductor chip, the upper redistribution layer including an upper insulating layer and an upper wiring pattern;

a connection layer electrically interconnecting the lower redistribution layer and the upper redistribution layer; and an upper passivation layer on the upper redistribution layer, wherein the seed layer includes:

a first seed part surrounding a side surface of the upper pad, a second seed part surrounding at least a portion of the lower surface of the upper pad, and a third seed part surrounding at least a portion of a side surface of the lower pad.

14. The semiconductor package as claimed in claim 13, wherein:

the seed layer further includes a fourth seed part covering a portion of a lower surface of the lower pad;

a horizontal length from an inner end of an upper surface of the fourth seed part to opposite ends of the lower surface of the lower pad is smaller than a horizontal length from the opposite ends of the lower surface of the lower pad to a point at which the external connecting terminal contacts the lower surface of the lower pad; and the semiconductor package further includes a void surrounded by the lower passivation layer, the UBM pad, the fourth seed part, and the external connecting terminal inside the fourth seed part.

15. The semiconductor package as claimed in claim 13, wherein:

a sum of a height of the second seed part and a height of the third seed part is smaller than a height of the lower pad; and the semiconductor package further includes a void surrounded by the lower passivation layer, the UBM pad, and the third seed part under the third seed part.

* * * * *